United States Patent
Harries et al.

(10) Patent No.: US 8,664,771 B2
(45) Date of Patent: Mar. 4, 2014

(54) APPARATUSES AND METHODS TO ENHANCE PASSIVATION AND ILD RELIABILITY

(75) Inventors: Richard J. Harries, Chandler, AZ (US); Sudarashan V. Rangaraj, Chandler, AZ (US); Bob Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/493,693

(22) Filed: Jun. 11, 2012

(65) Prior Publication Data

US 2012/0241952 A1 Sep. 27, 2012

Related U.S. Application Data

(62) Division of application No. 12/554,523, filed on Sep. 4, 2009, now Pat. No. 8,198,185, which is a division of application No. 11/392,270, filed on Mar. 28, 2006, now abandoned.

(51) Int. Cl.
*H01L 23/48* (2006.01)

(52) U.S. Cl.
USPC .................................. 257/778; 257/E21.503

(58) Field of Classification Search
USPC .................. 257/734, 738, 778, 793, E21.503
See application file for complete search history.

(56) References Cited

U.S. PATENT DOCUMENTS

| | | | |
|---|---|---|---|
| 6,060,373 A | 5/2000 | Saitoh | |
| 6,342,434 B1 | 1/2002 | Miyamoto et al. | |
| 6,774,497 B1 * | 8/2004 | Qi et al. | 257/783 |
| 6,794,751 B2 | 9/2004 | Kumamoto | |
| 7,005,321 B2 | 2/2006 | Chee | |
| 7,041,589 B2 * | 5/2006 | Lay et al. | 438/613 |
| 7,135,765 B2 | 11/2006 | Venkateswaran | |
| 7,355,279 B2 * | 4/2008 | Ke et al. | 257/737 |
| 7,759,162 B2 | 7/2010 | Karashima et al. | |
| 8,198,185 B2 | 6/2012 | Harries et al. | |
| 2002/0068453 A1 | 6/2002 | Grigg et al. | |
| 2005/0104225 A1 * | 5/2005 | Huang | 257/779 |

OTHER PUBLICATIONS

"U.S. Appl. No. 12/554,523, Final Office Action mailed Jan. 7, 2011", 8 pgs.
"U.S. Appl. No. 12/554,523, Non Final Office Action mailed Jul. 1, 2011", 7 pgs.
"U.S. Appl. No. 12/554,523, Non Final Office Action mailed Aug. 4, 2010", 6 pgs.
"U.S. Appl. No. 12/554,523, Notice of Allowance mailed Feb. 14, 2012", 5 pgs.
"U.S. Appl. No. 12/554,523, Notice of Allowance mailed Dec. 28, 2011", 5 pgs.
"U.S. Appl. No. 12/554,523, Preliminary Amendment mailed Sep. 4, 2009", 5 pgs.
"U.S. Appl. No. 12/554,523, Response filed Jun. 7, 2011 to Final Office Action", 6 pgs.
"U.S. Appl. No. 12/554,523, Response filed Nov. 1, 2011 to Non Final Office Action mailed Jul. 1, 2011", 5 pgs.
"U.S. Appl. No. 12/554,523, Response filed Dec. 6, 2010 to Non Final Office Action mailed Aug. 4, 2010", 6 pgs.

* cited by examiner

*Primary Examiner* — Quoc Hoang
(74) *Attorney, Agent, or Firm* — Schwegman, Lundberg & Woessner, P.A.

(57) ABSTRACT

Some embodiments of the present invention include apparatuses and methods relating to processing and packaging microelectronic devices that reduce stresses on and limit or eliminate crack propagation in the devices.

7 Claims, 7 Drawing Sheets

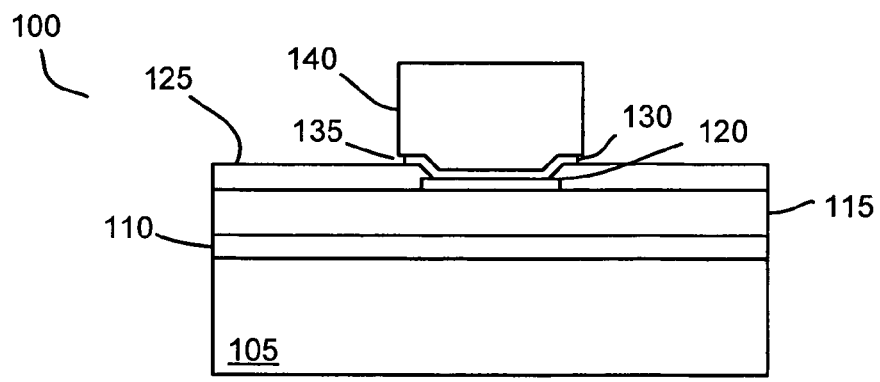
FIG. 1A – Prior Art
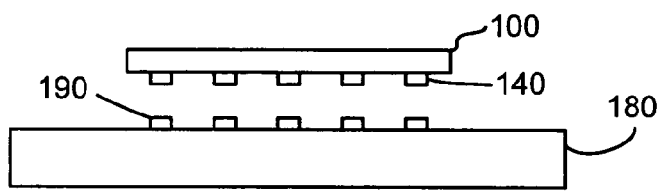
FIG. 1B – Prior Art
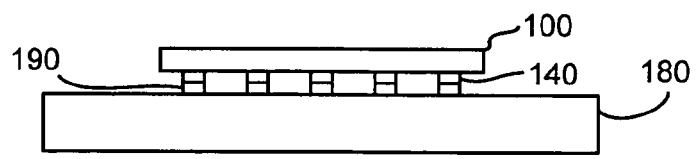
FIG. 1C – Prior Art
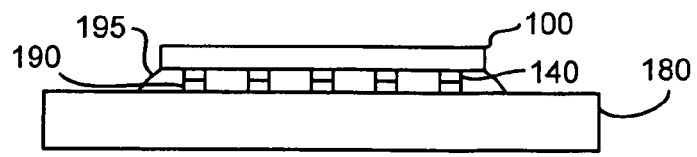
FIG. 1D – Prior Art

APPARATUSES AND METHODS TO ENHANCE PASSIVATION AND ILD RELIABILITY

CLAIM OF PRIORITY

This application is a divisional of U.S. application Ser. No. 12/554,523, filed Sep. 4, 2009 now U.S. Pat. No. 8,198,185, which is a divisional of U.S. application Ser. No. 11/392,270, filed Mar. 28, 2006 now abandoned, both of which are incorporated herein by reference in their entirety.

TECHNICAL FIELD

Embodiments of the invention relate to semiconductor processing and packaging technology. In particular, embodiments of the invention relate to enhancing passivation and interlayer dielectric reliability.

BACKGROUND

In the production of microelectronic products, a microelectronic chip or die is typically packaged before it is sold. The package may provide electrical connection to the chip's internal circuitry, protection from the external environment, and heat dissipation. In one package system, a chip may be flip-chip connected to a substrate. In a flip-chip package, electrical leads on the die are distributed on its active surface and the active surface is electrically connected to corresponding leads on a substrate.

FIGS. 1A-1D illustrate a prior art method for producing and packaging a microelectronic chip or die. FIG. 1A illustrates a die 100 including a substrate 105, a device region 110, an interconnect region 115, a bond pad 120, a passivation layer 125, a barrier metal 130, and a bump 140. Interconnect region 115 includes a plurality of metal interconnect layers that interconnect the devices of device region 110 and provide electrical routing to external circuitry. The metal interconnect layers include metal traces separated and insulated by an interlayer dielectric (ILD) material. Adjacent metal interconnect layers are typically connected by vias which are also separated and insulated by an ILD.

FIG. 1A also illustrates an undercut 135. Undercut 135 may result from a barrier metal layer etch in the presence of bump 140 which etches a layer of barrier metal material from passivation layer 125 and leaves barrier metal 130. Undercut 135 provides a location for the formation of undesired cracks in passivation layer 125 and/or interconnect region 115. For example, undercut 135 may cause a first crack in passivation layer 125 which subsequently causes an additional crack or cracks in the ILD of interconnect region 115. The subsequent cracks may be connected to the initial crack or they may be disconnected from, but related to, the initial crack. In particular, low dielectric constant (low-k) ILD materials are typically susceptible to cracks. The cracks in passivation layer 125 and/or interconnect region 115 may cause poor performance or failure of die 100.

Further, even in the absence of an undercut, bump 140 and the corners of bump 140 near passivation layer 125 are typically causes of undesired cracking and stress in passivation layer 125 and the ILD of interconnect region 115.

In FIGS. 1B and 1C, die 100 is flip-chip bonded to a substrate 180 which includes bumps 190. In bonding die 100 and substrate 180, stresses are typically imparted on die 100 due to coefficient of thermal expansion mismatches between die 100 and substrate 180, and other causes. These stresses may cause additional opportunity for cracking in passivation layer 125 and/or interconnect region 115. Further, after die attach and during "sit" time prior to further processing, cracks may continue to propagate in passivation layer 125 and/or interconnect region 115. In FIG. 1D, an underfill 195 is formed between die 100 and substrate 180.

BRIEF DESCRIPTION OF THE DRAWINGS

The invention is illustrated by way of example and not by way of limitation in the figures of the accompanying drawings, in which the like references indicate similar elements and in which:

FIGS. 1A-1D are cross-sectional views of a prior art method including flip-chip attaching a die to a substrate.

DETAILED DESCRIPTION

In various embodiments, apparatuses and methods relating to microelectronics processing and packaging are described with reference to figures wherein the same reference numbers are used to describe similar elements. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In processing and packaging microelectronic devices, it may be desirable to limit or eliminate cracking in the passivation layer of the device or the interlayer dielectric (ILD) of the interconnect region of the device. Further, it may be desirable to reduce the amount of stress on the passivation layer or the ILD while attaching the device to a substrate. Limiting or eliminating cracking and reducing the stresses on the passivation layer or ILD may reduce the probability of failures in the device, particularly when low-k ILD materials are used. Further, reducing stresses may enable the use of lead-free materials to attach the device to packaging substrates, as is further discussed below. Briefly, the present invention may provide structures and methods that reduce stresses on and limit or eliminate cracking in the passivation layer or the ILD of a microelectronic device.

FIGS. 2A-2E illustrate methods and apparatuses that may reduce stresses on and limit or eliminate cracking in the passivation layer or the ILD of a microelectronic device.

Figure 2A:
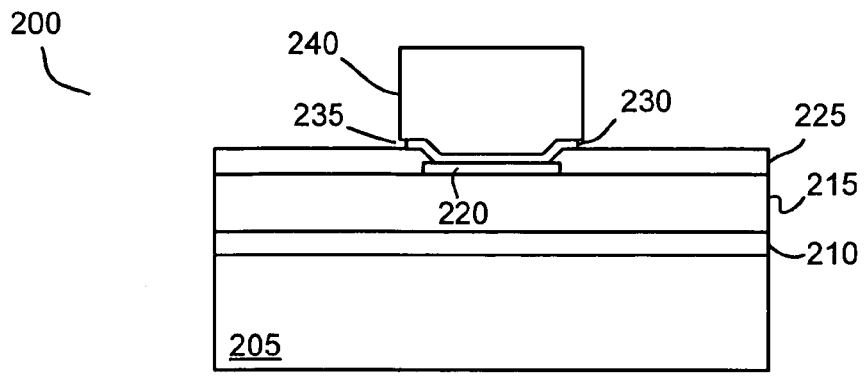
FIG. 2A is a cross-sectional view of partially formed wafer or die including a device region, an interconnect region, a bond pad, a barrier metal, a bump, and a passivation layer.

FIG. 2A illustrates a portion of a microelectronic device 200. In various embodiments, microelectronic device 200 may be a wafer or a die. Microelectronic device 200 may include a substrate 205, a device region 210, an interconnect region 215, a bond pad 220, a passivation layer 225, a barrier metal 230, and a bump 240. In some embodiments, microelectronic device 200 may also include an undercut 235. In an embodiment, microelectronic device 200 may include a plurality of bond pads, barrier metals, and bumps analogous to those shown in FIG. 2A.

Substrate 205 may include any suitable material or materials such as silicon, germanium, gallium arsenide, indium phosphide, silicon on insulator, or the like. Device region 210 may include any suitable devices. In an embodiment, device region 210 may include transistors. In other embodiments, device region 210 may include resistors or conductors. Interconnect region 215 may include a stack of metallization layers including metal interconnects separated and insulated by an ILD material or materials. In an embodiment, the ILD may include a low-k ILD, having a dielectric constant, k, of less than about 4. The metallization layers of interconnect region 215 may be electrically interconnected to adjacent metallization layers by vias. The vias may be separated and insulated by an ILD material or materials. In an embodiment, the ILD may include a low-k ILD. In various embodiments, interconnect region 215 may include about 5 to 9 metallization layers and corresponding via layers, although any number of metallization layers may be used.

Bond pad 220 may be any suitable material and size. In an embodiment, bond pad 220 may be a portion of a metallization layer of interconnect region 215. In an embodiment, bond pad 220 may include copper. Passivation layer 225 may include any suitable material. In an embodiment, passivation layer 225 may include a spark passivation material. In another embodiment, passivation layer 225 may include a polyimide material. In an embodiment, passivation layer 225 may surround bond pad 220 and expose bond pad 220 for barrier metal 230. In another embodiment (not shown), bond pad 220 may be surrounded by an adjacent and substantially coplanar ILD material, and passivation layer 225 may be over the ILD material and expose bond pad 220 for barrier metal 230.

Barrier metal 230 may include any conductive material or stack of conductive materials. Bump 240 may also include any conductive material or materials. In an embodiment, bump 240 may include copper. Undercut 235 may be of any size or shape, and may be a source for increased stress and undesirable crack formation and propagation in passivation layer 225 and interconnect region 215. In an embodiment, undercut 235 may not be present.

Figure 2B:
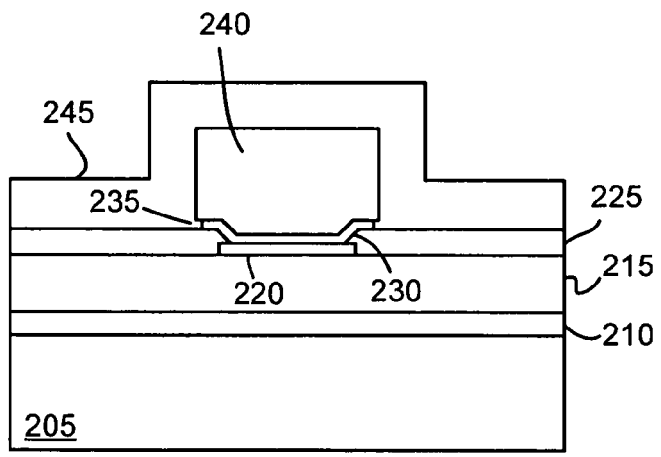
FIG. 2B is a view similar to FIG. 2A with a layer over the bump and the passivation layer.

As illustrated in FIG. 2B, a layer 245 may be formed over passivation layer 225 and bump 240. Layer 245 may be any suitable material or materials. In an embodiment, layer 245 may be a conformal layer. In an embodiment, layer 245 may include silicon nitride. In an embodiment, layer 245 may be a conformal layer formed by chemical vapor deposition (CVD). In another embodiment, layer 245 may be a conformal layer having a thickness in the range of about 1 to 15 microns. In an embodiment, layer 245 may be a conformal layer having a thickness in the range of about 4 to 10 microns. In another embodiment, layer 245 may be a conformal layer having a thickness in the range of about 5 to 15 microns.

Figure 2C:
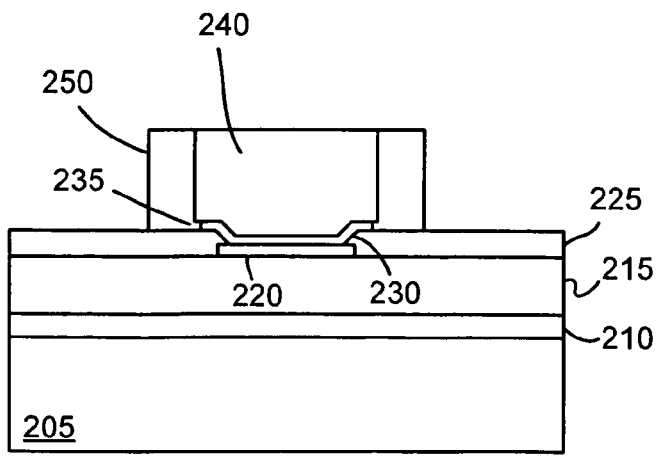
FIG. 2C is a view similar to FIG. 2B with a portion of the layer removed to form a sidewall structure.

As illustrated in FIG. 2C, portions of layer 245 may be removed to form structure 250. Structure 250 may be formed by any suitable technique. In an embodiment, structure 250 may be formed by an anisotropic etch of layer 245. In another embodiment, structure 250 may be formed by an anisotropic ion beam etch of layer 245. In an embodiment, layer 245 may be entirely removed from the top surface of bump 240. In an embodiment, the portion of layer 245 that does not form structure 250 may be entirely removed. However, in some embodiments, a portion or part of layer 245 that does not form structure 250, such as a thin remnant of layer 245 or residuals of layer 245, may remain on passivation layer 225. Further, in some embodiments, there may be a plurality of bumps and sidewall structures analogous to those shown in FIG. 2C. Between adjacent sidewall structures, there may be a gap that exposes the portion of passivation layer 225 between the adjacent sidewall structures.

In an embodiment, structure 250 may be around the sides of bump 240 and may therefore be referred to as a sidewall structure. In an embodiment, structure 250 may surround bump 240. In an embodiment, structure 250 may have about the same height as bump 240. In other embodiments, structure 250 may have a height that is less than the height of bump 240. Structure 250 may have any suitable width. In an embodiment, structure 250 may have a width in the range of about 1 to 15 microns. In another embodiment, structure 250 may have a width in the range of about 4 to 10 microns. In an embodiment, structure 250 may have a width in the range of about 5 to 15 microns.

Structure 250 may limit or eliminate the formation and propagation of cracks in passivation layer 225 or the ILD of interconnect region 215. Also, structure 250 may lower the stress on passivation layer 225 and the ILD of interconnect region 215. In an embodiment, structure 250 may limit or eliminate cracks and lower the stresses on passivation layer 225 and the ILD of interconnect region 215 by encapsulating undercut 235. In another embodiment, structure 250 may limit or eliminate cracks and lower the stresses on passivation layer 225 and the ILD of interconnect region 215 by providing load sharing with bump 240. In an embodiment, structure 250 may lower the stress on passivation layer 225 and the ILD of interconnect region 215 during subsequent processing, such as die attach.

Figure 2D:
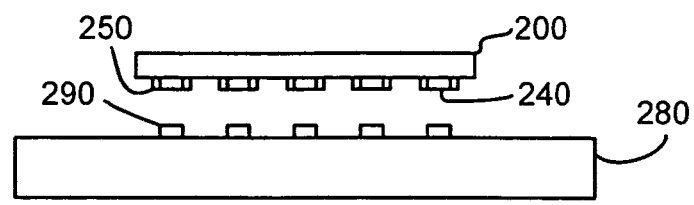
FIG. 2D is a cross sectional view of a substrate including bumps and sidewall structures being flip-chip attached to a substrate including contacts.
Figure 2E:
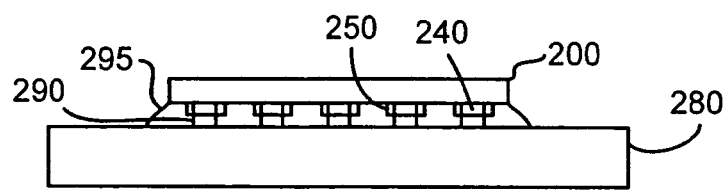
FIG. 2E is a view similar to FIG. 2D with the substrates attached and an underfill between them.

As illustrated in FIGS. 2D and 2E, device 200 may be attached to a substrate 280 including contacts 290; and an underfill 295 may be formed between device 200 and substrate 280. In FIGS. 2D and 2E, some details of FIG. 2C are not shown for the sake of clarity.

In an embodiment, the formation of structure 250 may be at or near the end of wafer processing and the attachment of device 200 and substrate 280 may be performed after dicing substrate 205. In an embodiment, attaching device 200 and substrate 280 may include a flip-chip attachment. In an embodiment, attaching device 200 and substrate 280 may include a reflow process. In an embodiment, underfill 295 may include a capillary underfill. In another embodiment, underfill 295 may include a no-flow underfill.

Substrate 280 may be any suitable packaging substrate, such as a printed circuit board (PCB), interposer, motherboard, card, or the like. In some embodiments, contacts 290 may extend away from the surface of substrate 280 and contacts 290 may be considered bumps. In an embodiment, contacts 290 may be bumps that include a lead-based solder. In other embodiments, contacts 290 may be bumps that include a lead-free solder. In particular, the use of the methods and apparatus described may enable the use of lead-free solders, which are typically less malleable than lead-based solders. In an embodiment, contacts 290 may be bumps that include a lead-free solder comprising tin, silver, or indium.

FIGS. 3A-3H illustrate methods and apparatuses that may reduce stresses on and limit or eliminate cracking in the passivation layer or the ILD of a microelectronic device.

Figure 3A:
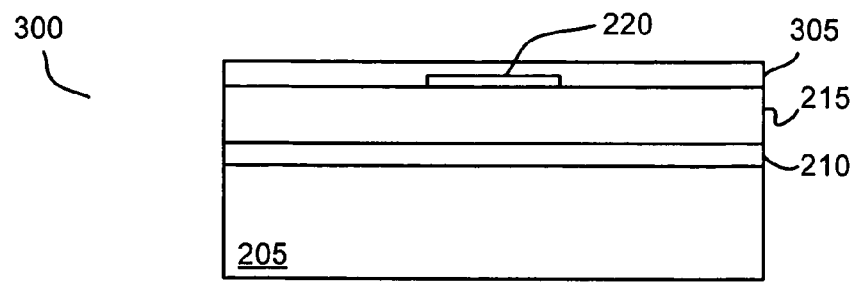
FIG. 3A is a cross-sectional view of partially formed wafer or die including a device region, an interconnect region, a bond pad, and passivation layer.

FIG. 3A illustrates a portion of a microelectronic device 300. In various embodiments, microelectronic device 300 may be a wafer or a die. Microelectronic device 300 may include substrate 205, device region 210, interconnect region 215, bond pad 220, and passivation layer 305.

Passivation layer 305 may include any suitable material. In an embodiment, passivation layer 305 may include a spark passivation material. In another embodiment, passivation layer 305 may include a polyimide material. In an embodiment, passivation layer 305 may surround and cover bond pad 220. In another embodiment (not shown), bond pad 220 may be surrounded by an adjacent and substantially coplanar ILD material, and passivation layer 305 may be over the ILD material and bond pad 220.

Figure 3B:
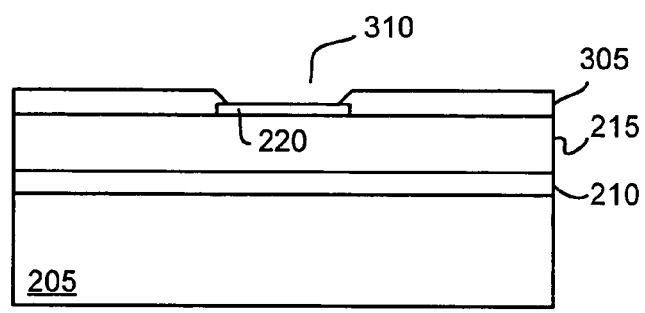
FIG. 3B is a view similar to FIG. 3A with a portion of the passivation layer removed to expose the bond pad.

As illustrated in FIG. 3B, an opening 310 may be formed to expose bond pad 220. In an embodiment, a portion of bond pad 220 may be exposed. In an embodiment, the entire top surface of bond pad 220 may be exposed. Opening 310 may be formed by any available technique. In an embodiment, opening 310 may be formed by lithography and etch steps.

Figure 3C:
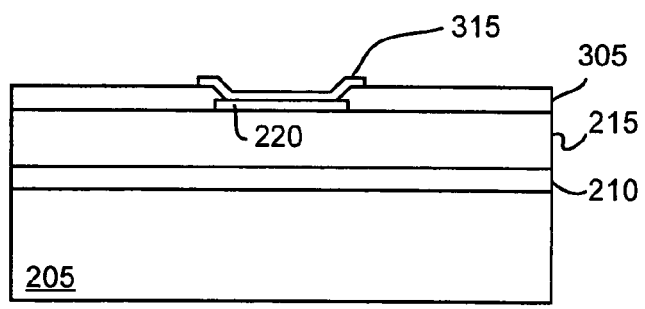
FIG. 3C is a view similar to FIG. 3B with a barrier metal formed over the bond pad.

As illustrated in FIG. 3C, a barrier metal 315 may be formed. In an embodiment, barrier metal 315 may be formed over bond pad 220 and a portion of passivation layer 305. In another embodiment, barrier metal 315 may be formed only over bond pad 220. Barrier metal 315 may include any suitable material or stack of materials, and may be formed by any suitable technique. In an embodiment, barrier metal 315 may be formed by deposition, lithography and etch techniques.

Figure 3D:
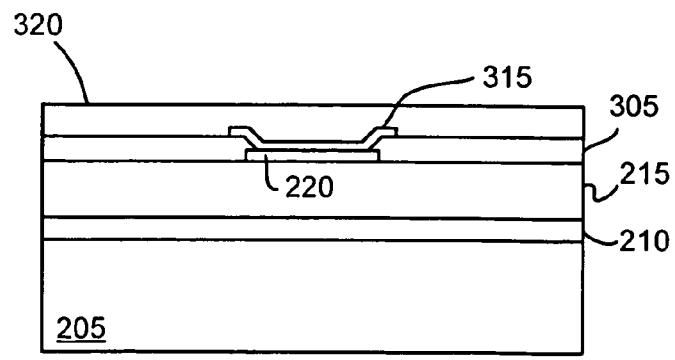
FIG. 3D is a view similar to FIG. 3C with a layer formed over the barrier metal and the passivation layer.

As illustrated in FIG. 3D, a layer 320 may be formed over barrier metal 315 and passivation layer 305. Layer 320 may be any suitable material and may be formed by any suitable technique. In an embodiment, layer 320 may include a passivation material. In an embodiment, layer 320 may include a spark passivation material. In another embodiment, layer 320 may include a polyimide material. In an embodiment, layer 320 may include a photoresist. In an embodiment, layer 320 may be formed by a spin on technique.

Figure 3E:
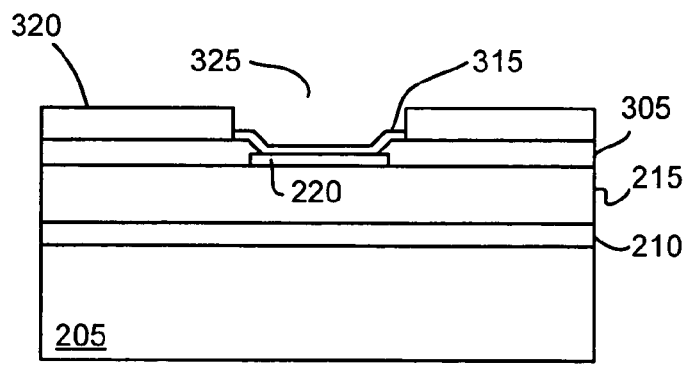
FIG. 3E is a view similar to FIG. 3D with a portion of the layer removed to expose the barrier metal.

As illustrated in FIG. 3E, an opening 325 may be formed to expose barrier metal 315. In an embodiment, a portion of barrier metal 315 may be exposed. In another embodiment, the entire top surface of barrier metal 315 may be exposed. Opening 320 may be formed by any available technique. In an embodiment, opening 320 may be formed by lithography and etch techniques.

Figure 3F:
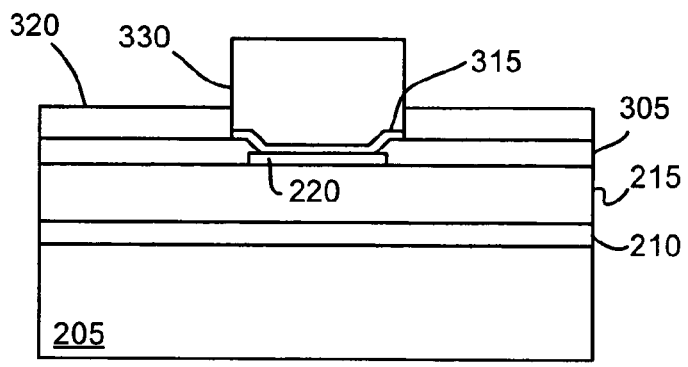
FIG. 3F is a view similar to FIG. 3E with a bump formed over the barrier metal.

As illustrated in FIG. 3F, a bump 330 may be formed over barrier metal 315. Bump 330 may include any suitable material and may be formed by any suitable technique. In an embodiment, bump 330 may include copper. In an embodiment, bump 330 may be formed by electroplating. In an embodiment, bump 330 may have a height that extends above the height of layer 320. In another embodiment, bump 330 may have a height that is about coplanar with the height of layer 320.

Layer 320 may limit or eliminate the formation and propagation of cracks in passivation layer 305 and the ILD of interconnect region 215. Also, layer 320 may lower the stress on passivation layer 305 and the ILD of interconnect region 215. In an embodiment, layer 320 may limit or eliminate cracks and lower the stresses on passivation layer 305 and the ILD of interconnect region 215 by providing load sharing with bump 330. In an embodiment, layer 320 may lower the stress on passivation layer 305 and the ILD of interconnect region 215 during subsequent processing, such as die attach.

Figure 3G:
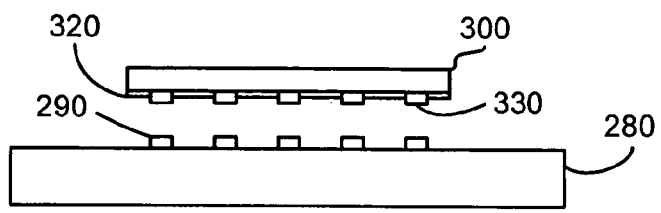
FIG. 3G is a cross sectional view of a substrate including bumps and a layer among the bumps being flip-chip attached to a substrate including contacts.
Figure 3H:
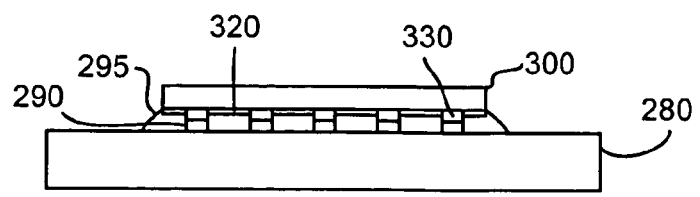
FIG. 3H is a view similar to FIG. 3G with the substrates attached and an underfill between them.

As illustrated in FIGS. 3G and 3H, device 300 may be bonded to substrate 280 including contacts 290; and underfill 295 may be formed between substrate 205 and substrate 280. In FIGS. 3G and 3H, some details of FIG. 3F are not shown for the sake of clarity.

In an embodiment, the formation of layer 320 may be at or near the end of wafer processing and attachment of device 300 and substrate 280 may be performed after dicing substrate 205. In an embodiment, attaching device 300 and substrate 280 may include a flip-chip attachment. In an embodiment, attaching device 300 and substrate 280 may include a reflow process. In an embodiment, underfill 295 may include a capillary underfill. In another embodiment, underfill 295 may include a no-flow underfill.

As discussed with reference to FIGS. 2D and 2E, contacts 290 may be bumps that include a lead-free solder such as a solder comprising tin, silver, or indium. In particular, the use of the methods and apparatus described may enable the use of lead-free solders, which are typically less malleable than lead-based solders.

FIGS. 4A-4E illustrate methods and apparatuses that may reduce stresses on and limit or eliminate cracking in the passivation layer or the ILD of a microelectronic device.

Figure 4A:
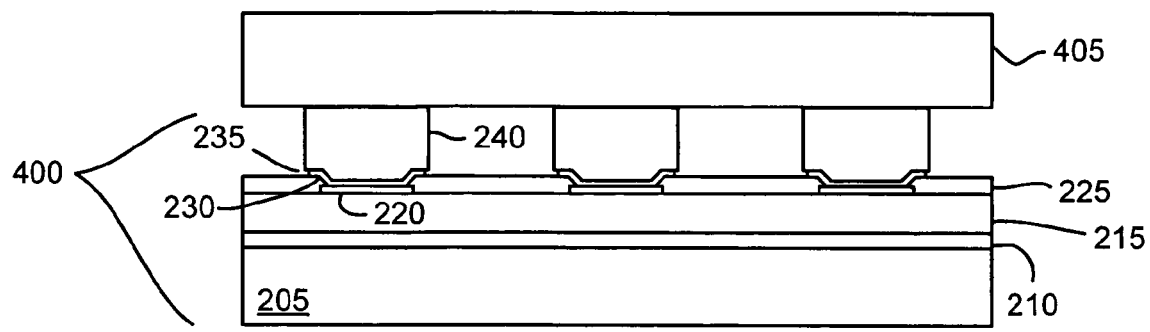
FIG. 4A is a cross-sectional view of partially formed wafer or die including a device region, an interconnect region, a bond pad, a barrier metal, a plurality of bumps, and a passivation layer, and a fixture over the bumps.

FIG. 4A illustrates a portion of a microelectronic device 400 and a fixture 405. In various embodiments, microelectronic device 400 may be a wafer or a die. Microelectronic device 400 may include substrate 205, device region 210, interconnect region 215, bond pad 220, and passivation layer 225. In some embodiments, microelectronic device 400 may also include an undercut 235. Microelectronic device 400 and fixture 405 may be put together and held together by any suitable technique.

Figure 4B:
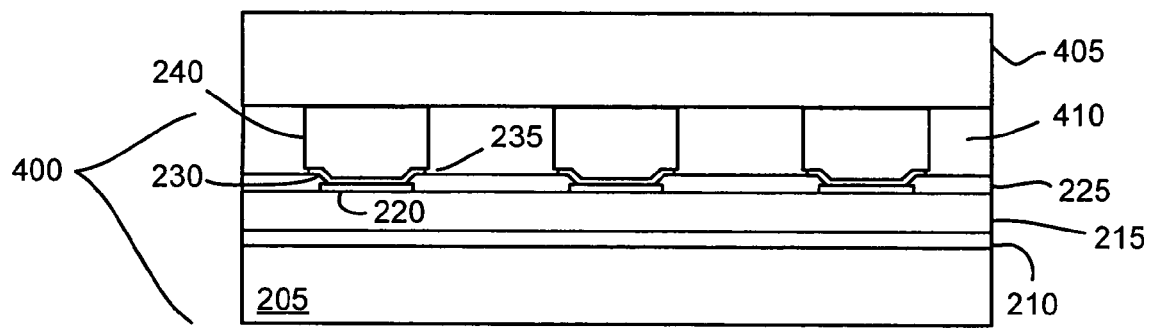
FIG. 4B is a view similar to FIG. 4A with a material between the passivation layer and the fixture and around the bumps.

As illustrated in FIG. 4B, a material 410 may be formed between fixture 405 and passivation layer 225, and around bumps 240. Material 410 may be any suitable material and may be formed by any suitable technique. In an embodiment, material 410 may include an underfill material. In another embodiment, material 410 may include an epoxy. In an embodiment, material 410 may be injected from the side of fixture 405 and microelectronic device 400. In an embodiment, fixture 405 may prevent material 410 from covering bumps 240.

Figure 4C:
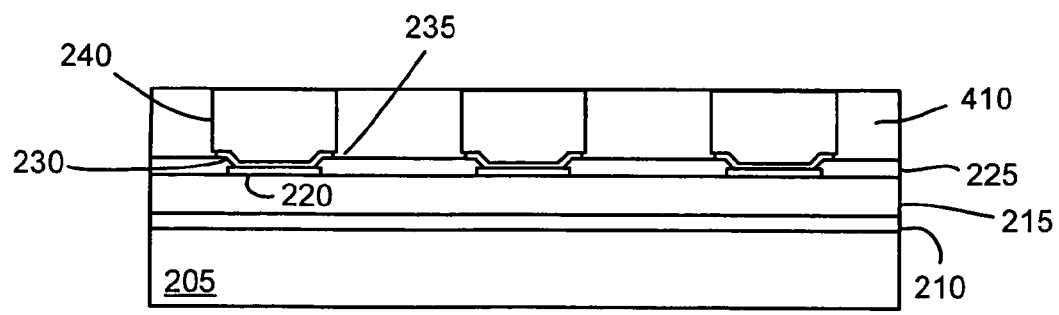
FIG. 4C is a view similar to FIG. 4B with the fixture removed.

As illustrated in FIG. 4C, fixture 405 may be removed to leave material 410 over passivation layer 225 and around bumps 240. In an embodiment, material 410 may leave a portion of bumps 240 exposed. In an embodiment, a cure step may be performed to harden material 410.

Material 410 may limit or eliminate the formation and propagation of cracks in passivation layer 225 and the ILD of interconnect region 215. Also, material 410 may lower the stress on passivation layer 225 and the ILD of interconnect region 215. In an embodiment, material 410 may limit or eliminate cracks and lower the stresses on passivation layer 225 and the ILD of interconnect region 215 by encapsulating undercut 235. In another embodiment, material 410 may limit or eliminate cracks and lower the stresses on passivation layer 225 and the ILD of interconnect region 215 by providing load sharing with bump 240. In an embodiment, material 410 may lower the stress on passivation layer 225 and the ILD of interconnect region 215 during subsequent processing, such as die attach.

Figure 4D:
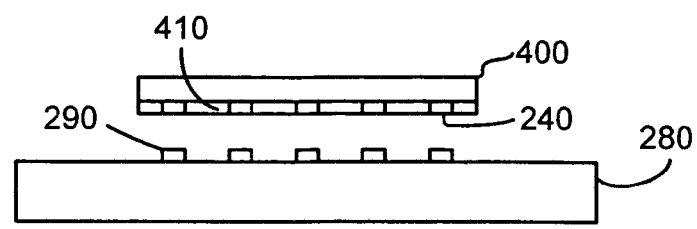
FIG. 4D is a cross sectional view of a substrate including bumps and a material around the bumps being flip-chip attached to a substrate including contacts.
Figure 4E:
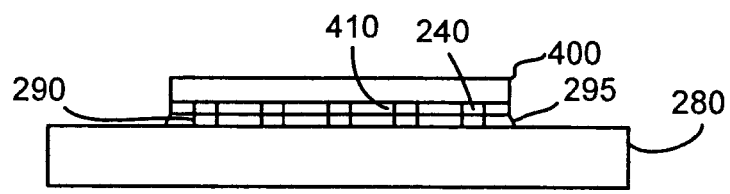
FIG. 4E is a view similar to FIG. 4D with the substrates attached and an underfill between them.

As illustrated in FIGS. 4D and 4E, device 400 may be bonded to substrate 280 including contacts 290, and underfill 295 may be formed between device 400 and substrate 280. In FIGS. 4D and 4E, some details of FIG. 4C are not shown for the sake of clarity.

In an embodiment, the formation of material 410 may be at or near the end of wafer processing and attachment of device 400 and substrate 280 may be after dicing of substrate 205. In an embodiment, attaching device 400 and substrate 280 may include a flip-chip attachment. In an embodiment, attaching device 400 and substrate 280 may include a reflow process. In an embodiment, underfill 295 may include a capillary underfill. In another embodiment, underfill 295 may include a no-flow underfill.

As discussed with reference to FIGS. 2D and 2E, contacts 290 may be bumps that include a lead-free solder such as a solder comprising tin, silver, or indium. In particular, the use of the methods and apparatus described may enable the use of lead-free solders, which are typically less malleable than lead-based solders.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. An apparatus comprising:
   a first bump and a second bump on a surface of a substrate;
   a first sidewall structure adjacent to the first bump and on the surface;
   a second sidewall structure adjacent to the second bump and on the surface;
   a gap between the first sidewall structure and the second sidewall structure that exposes at least a portion of the substrate surface;
   wherein the first sidewall structure has a width in the range of about 1 to 15 microns; and
   an underfill surrounding the first and second sidewall structures.

2. The apparatus of claim 1, wherein the substrate comprises a device region and an interconnect region, the interconnect region including a low-k interlayer dielectric material.

3. The apparatus of claim 1, further comprising an undercut between the first bump and the surface, wherein the undercut is encapsulated by the first sidewall structure.

4. The apparatus of claim 1, wherein the first sidewall structure comprises silicon nitride.

5. The apparatus of claim 1, wherein the first bump comprises copper.

6. The apparatus of claim 1, further comprising a contact on a second substrate, wherein the first bump and the contact are electrically connected.

7. The apparatus of claim 6, wherein the contact comprises a third bump including tin and silver.

* * * * *